United States Patent [19]
Lee

[11] Patent Number: 5,375,655
[45] Date of Patent: Dec. 27, 1994

[54] HEAT SINK APPARATUS

[76] Inventor: Yong N. Lee, 1010 W. Lonnquist Blvd., Mt. Prospect, Ill. 60056

[21] Appl. No.: 40,864

[22] Filed: Mar. 31, 1993

[51] Int. Cl.[5] ............................................... F28F 7/00
[52] U.S. Cl. ..................................... 165/185; 361/690
[58] Field of Search ........................... 165/80.3, 185; 174/16.3; 361/697, 709, 710, 690

[56] References Cited

U.S. PATENT DOCUMENTS

| | | | |
|---|---|---|---|
| 3,180,404 | 4/1965 | Nelson et al. | 165/47 |
| 4,884,631 | 12/1989 | Rippel | 165/185 |
| 5,195,576 | 3/1993 | Hatada et al. | 165/80.3 |

FOREIGN PATENT DOCUMENTS 246432  11/1987  European Pat. Off. ........... 174/16.3

OTHER PUBLICATIONS

IBM Tech. Disclosure Bulletin vol. 25 #2 Jul. 1982 Biskeborn et al, "Cooling Fin Structure" p. 618.

*Primary Examiner*—Allen J. Flanigan
*Attorney, Agent, or Firm*—Robert A. Brown

[57] ABSTRACT

An improved heat sink apparatus that utilizes either natural or forced convection to transfer heat generated by a high temperature medium to a lower temperature medium or converts cold energy from a low temperature fluid or solid medium to a different or higher temperature stage or condition of energy. The apparatus includes a thermally conductive base plate, a plurality of thick corrugated finned assembly components constructed and arranged in abutting relationship and offset from each other so as to cause a circuitous path of fluid flow therethrough. The apparatus also may include the base plate and a plurality of thick, sawtooth shaped, or segmented fins mounted thereon. The length of fluid travel from one finned component to an abutting finned component along the heat transfer surface is controlled in order to prevent development of thermal boundary layer on the inner surface of the finned assembly components.

12 Claims, 5 Drawing Sheets

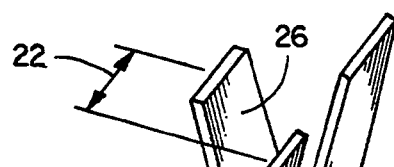
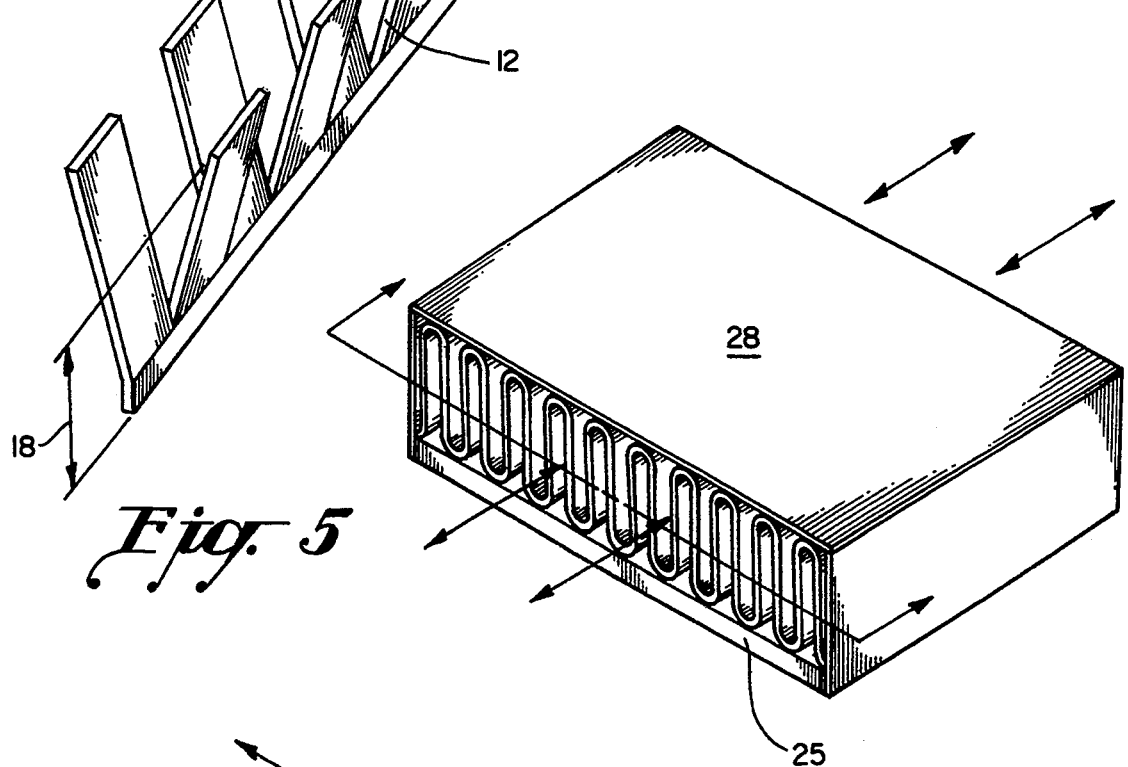
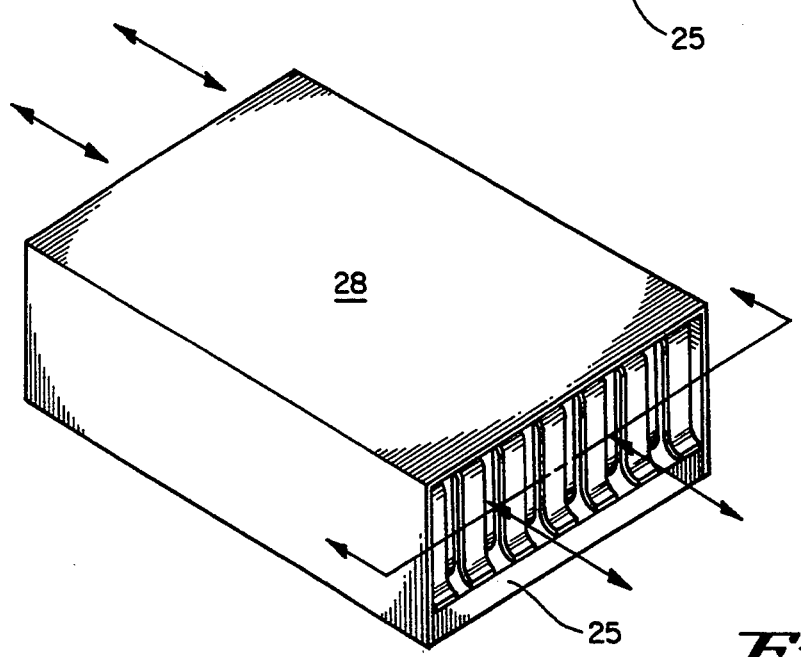

HEAT SINK APPARATUS

BACKGROUND OF THE INVENTION

The present invention relates generally to power electronic systems and to thermoelectric heat transfer equipment and more particularly to both cold and heat sink apparatus wherein a cold sink device absorbs heat from a fluid or a solid object to be cooled and a heat sink device receives heat from a source and expels it to ambient fluid conditions.

DESCRIPTION OF THE PRIOR ART

In electronics power systems, heat generated by power semiconductors needs to be dissipated to ambient air by heat sinks for the power systems to operate properly. Thermoelectric cooling systems for electronics cooling move heat from air in an enclosure at a certain temperature, to ambient air, usually at a higher temperature. At the low temperature side, the cold sink absorbs heat from air in the enclosure, while the heat sink rejects heat to ambient air. The heat to be rejected to the ambient air is equal to the sum of the absorbed heat and the power input added to operate the thermoelectric system. In order for an thermoelectric system to function properly, both the cold and heat sinks must function adequately.

Conventional cold and heat sink devices are usually made of aluminum extrusions and formed into a grouping of long, thin, usually rectangular, fins and placed within an enclosure. Even though extruded aluminum is still being used extensively because of its simple structure and relatively economic cost of production, an aluminum extrusion heat sink has many drawbacks. Among the major ones, the first is that the surface area of fins available for heat absorption or dissipation is very limited, because fin thickness cannot be made thinner than 0.125" if the fin height is 0.75" and the fin gap is close to 0.2". Therefore, if the need to cope with future contemplated thermal loads continues to increase at the present rate, none of the conventional known heat sinks can meet the commercial heat absorbing and heat dissipation requirements of industry. The present invention relates generally to both cold and heat sinks which are fabricated to overcome the above drawbacks. The basic inventive concept disclosed herein applies to both cold and heat sinks, because properly designed heat sinks can be also adapted for use as efficiently operable cold sinks, and is not limited to air, but applies to any fluid or sold objects. Therefore, no distinction is to be made between either cold or heat sinks and accordingly, both are referred to as heat sinks in the description of the present invention.

To cope with the above problem, it has been the customary practice in commercial markets to fabricate the mounting plate and fins separately and join them together with thermally conductive adhesives. Prior art disclosures, which are relevant to the present invention are found in U.S. Pat. Nos. 3,180,404 to Nelson et al and 4,884,631 to Rippel. These references teach how to improve the heat dissipating capability of a heat sink over that of a conventional extruded heat sink; for example, the Nelson et al '404 patent increases heat transfer surface area of the fins to a greater extent than that obtainable by extruded heat sinks. The prior art heat sink of Rippel '631 uses thin aluminum sheet to form a fin assembly that may be corrugated, honeycombed or shaped in a serpentine configuration. These differently shaped fin assemblies are then bonded to the base plate to form a finished heat sink. As shown by the aforementioned disclosures, by increasing heat transfer surface area, the prior art heat sinks permit increases in heat dissipation capability that are substantially higher than conventional extruded heat sinks. However, there are many drawbacks and problems created by the concept of merely increasing heat transfer surface area in order to achieve a higher heat dissipation capability as discussed hereinbelow.

The increase of heat transfer surface area, especially in natural convection applications when it is not possible to use a fan for forcing circulation of air across the finned surfaces of a heat sink, because of noise and other reliability problems, severely limits or restricts its efficiency. In other words, this concept is fatally flawed in that it causes a phenomenon that may be referred to as, "choking condition". As the numbers of corrugations or other types of finned configurations are increased so as to bring about an enlarged heat transfer surface area, the ratio of fin gap to length of fin becomes small, which increases the likelihood that two thermal boundary layers in the fin gap developing or growing along the fin length will merge before the fluid exits from the channel as defined between the two fins. Accordingly, the flow of fluid, such as air, through the gap between the finned surfaces becomes more difficult caused by friction between the fluid and the surfaces of the fins. Thus, the unrestricted channel, through which the fluid flows because of the buoyant effect caused by the thermal gradient between the fins and the gap therebetween, becomes narrower and narrower, until the flow reaches a minimum velocity, resulting in a possible complete stoppage of fluid flow. This causes the "choking condition" problem. Past attempts to avoid this problem have included enlarging the gap between fins for a particular length of fin. For example, in prior art applications, to prevent development of a choking condition, fins of 6 inches in length would require a gap of at least 0.3 inches therebetween; and, of course, fins of greater length would necessitate providing for a much larger gap than that mentioned above.

A second problem occurs with prior inventions, whether under forced or natural convection applications. When attempts are made to increase the rate of heat transfer by increasing heat transfer surface area, air flow is possible only in the direction of fin length. That is, the fluid flow or air pattern is not reversible through the flow channel between finned surfaces. This fact is a significant constraint in the design of an efficient heat sink and permits very little design flexibility. In a particular situation where it is required to have fluid flow onto a heat sink, the prior inventions resort to splitting the heat sink into two parts and direct a single air flow pattern into a plenum and thereafter divert it ninety degrees into two separate opposite directions for passing across the two separate portions of the heat sink. As can be readily understood, a configuration of this type results in a large, bulky heat sink.

Construction of prior art heat sinks that employ high fin density are possible only by using very thin fins in the order of 0.005 inches with a maximum height of only 0.60 inch. In addition, these types of heat sinks can be used only with forced air flow, but are not feasible for natural convection heat dissipation.

SUMMARY OF THE INVENTION

Accordingly, it is a primary object of the present invention to provide an improved heat sink apparatus that increases, under both natural and forced convection applications, the rate of heat absorption and/or heat dissipation.

An additional object of the present invention is to provide an improved heat sink configuration which can receive air flow supply from three directions: namely; longitudinal to the heat sink, at a right angle to the finned configuration, and from directly above the finned assembly without incurring the need to split the heat sink into separate finned assemblies, so that manufacturing cost of the heat sink can be kept at a minimum.

A further object of the present invention is to provide an improved heat sink apparatus that is flexible in its design and also performs in a manner superior to that of conventional heat sinks.

Another object of the present invention is to provide an improved heat sink apparatus that can be used for either forced or natural convection heat transfer applications and either within or without any restrictions imposed by placing cover plates that partially enclose about a finned assembly.

An even further object of the present invention is to provide an economical means for manufacturing heat sinks.

Still another object of the present invention is to provide an improved heat sink apparatus wherein either corrugated finned surface, or segmented fin configurations are employed to take advantage of boundary layer fluid flow patterns and thereby improve heat absorption and/or dissipation.

An improved heat sink apparatus constructed in accordance with the present invention comprises a thick base plate and a plurality of heat transfer components joined thereto by thermally conductive bonding material. One version of the inventive heat transfer fin assembly component is a plurality of fin assembly elements comprising a multiplicity of corrugations made from a thick strip of highly conductive material. Use of the relatively thick strip material rather than a thin sheet permits utilization of a very high overall height of the corrugated fin assembly components as measured from and above a base plate. A plurality of separate or individual corrugated fin assembly components are joined together to make a complete heat sink apparatus. Each of the separate fin assembly components is arranged at an offset or staggered position in abutting relationship to an adjacent fin assembly component, the offset being equal to one half of a corrugation pitch. Another version of the inventive heat transfer component is a plurality of segmented, thick fin assemblies individually mounted on a base plate. This version of a fin element is formed from a straight, thick strip of material which is cut, except for the bottom portions of the fins that are to be bonded to the base plate, into many segments and each segment is bent outwardly at a predetermined angle alternately to one side, such as right, and to the other side, such as left, along the longitudinal direction of the fin element. Each fin element is inserted in a preformed groove of the base plate and the two are joined together with thermally conductive adhesives, by solder, brazing, or other suitable means. Utilizing a greater thickness of fin material enables the employment of a taller height of fin element. Briefly, a heat sink apparatus of the present invention comprises thermally conductive base plate means, a plurality of elongate fin assembly component means mounted on the base plate means for thermal conductivity therebetween, each of the fin assembly component means including a thick strip of heat conductive material formed into a plurality of heat conducting elements wherein each of the heat conducting elements has heat element pitch means and a fluid flow channel, a plurality of the fin assembly component means arranged in abutting contact with each other and offset by a distance equal to the heat element pitch means of each of the plurality of heat conducting elements, and each of the fluid flow channels of each of the heat conducting elements operable to receive fluid flow therethrough and having a linear dimension at least equal to the thickness of the strip of heat conductive material, whereby when fluid flows through each of the fluid flow channels thermal boundary layer is prevented from development on the inner peripheral surface of each of the heat conducting elements.

BRIEF DESCRIPTION OF THE DRAWING

The foregoing and other characteristics, objects, features and advantages of the present invention will become more apparent upon consideration of the following detailed description, having reference to the accompanying figures of the drawing, wherein:

FIG. 4 shows still another embodiment of an individual fin assembly component. In this embodiment, a conventional fin of heat transfer material is cut, or segmented in a traverse direction, except for its bottom portion that is thermally joined with the plate, and the fin element segmented, upper arm portions are bent alternately to a predetermined angle along the longitudinal direction of the fin element with respect to either side of the integral bottom portion of the fin element; or may be maintained on only one side or only on the other of the bottom portion of the fin element.

FIG. 5 shows a heat sink apparatus including a cover means that is effective to direct fluid over corrugated fin assembly components so as to flow through the apparatus in either direction as indicated by arrows.

FIG. 6 is similar to FIG. 5, except that the cover means directs fluid flow in either direction at an angle 90 degrees from the direction shown in FIG. 5.

DESCRIPTION OF A PREFERRED EMBODIMENT

Figure 1:
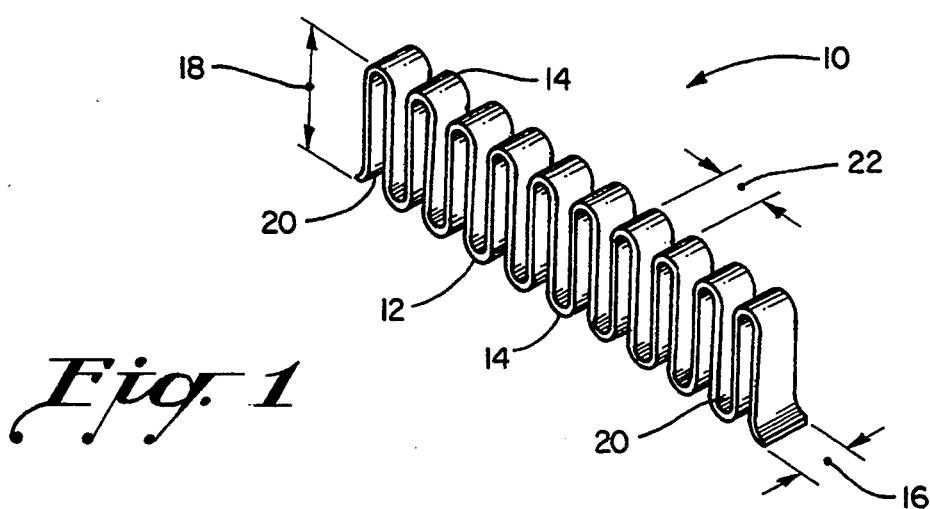
FIG. 1 is a conceptual view of one individual corrugated fin assembly component having an arch-like configuration. A number of individual fin assembly components are needed to make one heat sink; the individual assembly components are arranged such that one component is offset by one half of the corrugation pitch relative to the next. A complete assembly of fin assembly components is mounted on a thick plate and bonded to the plate via adhesive, solder, brazing or other suitable means.

In a natural convection heat sink, the thickness of a thermal boundary layer grows on the surface of a fin along a vertical channel as defined between adjacent fins to reach a fully developed condition, and eventually the buoyant force of fluid flow acting upwardly balances with the frictional force of fluid flow acting downwardly, resulting in stagnant fluid flow and causing a so called "choking condition" within the vertical channel, a problem as discovered in prior art references relating to heat absorption and/or heat dissipation. By keeping short the linear distance the fluid travels through either a vertical or horizontal channel, it is possible to prevent the thermal boundary layer from becoming fully developed. By maintaining a short, minimum distance channel, or as sometimes referred to as "linear distance" or "length" of the channel, the thermal boundary layer is prevented from becoming fully developed, thus avoiding the choking condition. This is due to the fact that a thermal boundary layer is thinner in a short, or minimum linear distance channel. The same advantage is also obtainable in forced fluid flow applications, where a fan is used to increase circulation across finned surfaces of a heat sink, resulting in an improved performance.

The present invention employs the new and unobvious concept of providing a thick strip of corrugated or other suitable finned surface components wherein adjacent components are offset by a preselected heat element pitch, such as a corrugation, segmentation, or the like, and a predetermined linear dimension of channel for flow of fluid from one corrugated finned component to the next abutting finned component. In addition to corrugations, the present invention concept comprises a series of a plurality of segmented fins forming a finned component for mounting on a base plate. Each finned component includes a plurality of segments bonded to the base plate and having upper end portions bent outwardly at a predetermined angle alternately between one side or the other of the longitudinal axis of the finned component. Thus, it is possible in natural convection heat sink applications to avoid a choking condition problem and thereby increase the efficiency of a heat sink apparatus. The corrugated finned surface or the segmented fin surface is fabricated from thick strip, thermally conductive material, as for example, having a thickness ranging between from at least as low as 0.010 of an inch to 0.10 of an inch or more. Moreover, using the present concept as disclosed, permits the concomitant design of a relatively short length of flow channel between corrugated finned surface components, or between segments of the segmented fin surface, in the order of a minimum of 0.10 of an inch, but is not limited in length at all and may range to a length of 0.50 of an inch or longer. As contemplated by the present invention, a plurality of individual narrow width corrugated finned surface assemblies are placed adjacent to one another and are offset or staggered by one half of a corrugation pitch. Also, as contemplated by the present invention, a plurality of segmented fins are placed adjacent to one another to form a multitude of short channels. The short distance through the channel between finned surfaces of the present invention is contrasted to that employed in the prior inventions where the channel distance is the same as the overall length of the complete heat sink assembly. It will be understood that the fabrication of single corrugated finned elements and ultimate assembly thereof in bonding relationship to a base plate is achievable at a lower power requirement and lesser cost than that encountered when forming a conventional full length corrugated finned heat sink apparatus, due to a significant reduction of investment in capital equipment cost.

The configuration of the heat sink described above makes a fluid or air supply source very flexible. For instance, air can be supplied from three directions without changing the heat sink arrangement or configuration of finned surface components. In this connection, it is possible to obtain longitudinal flow, cross flow, and flow over and above the heat sink elements. On the other hand, only longitudinal flow is possible in prior art disclosures. As will be discussed hereinbelow, at least three flow directions, and possibly others, may be combined with different combinations of heat sink covers, resulting in five different functional accomplishments of heat transfer by the same heat sink apparatus. Thus, the present invention is equivalent to the operation of five different types of heat sinks, which can translate into a meaningful and significant design flexibility and significant cost savings in the manufacture of these products.

The present invention also enables one to make the finned surface corrugation height or segmented fin height to desired heights as high as 2.5 inches or higher. A heat sink element with thick, tall fin assembly components forming a multitude of short flow channels and offset from each other by half a heat element or corrugation pitch is an ideal configuration for both natural and forced convection heat dissipation. This is particularly important for natural convection applications because the thermal boundary layer thickness cannot grow or develop within a single fin assembly component due to the short distance of fluid travel in an upward direction within the gap between finned surfaces. The thermal boundary layer partially established in a fin assembly component is interrupted or broken up as fluid flow moves from the end of the channel into a next, offset channel of an adjacent fin assembly component and a new thermal boundary layer begins as the fluid flows into the entrance of the adjacent fin assembly component. It will be readily understood that this process is repeated as the fluid flows through the apparatus so that no thermal boundary layer builds up. The net result is that no thermal boundary layers will develop fully within the heat sink apparatus and cause a "choking condition", no matter how many finned surface assembly components are place adjacent to one another.

Figure 2:
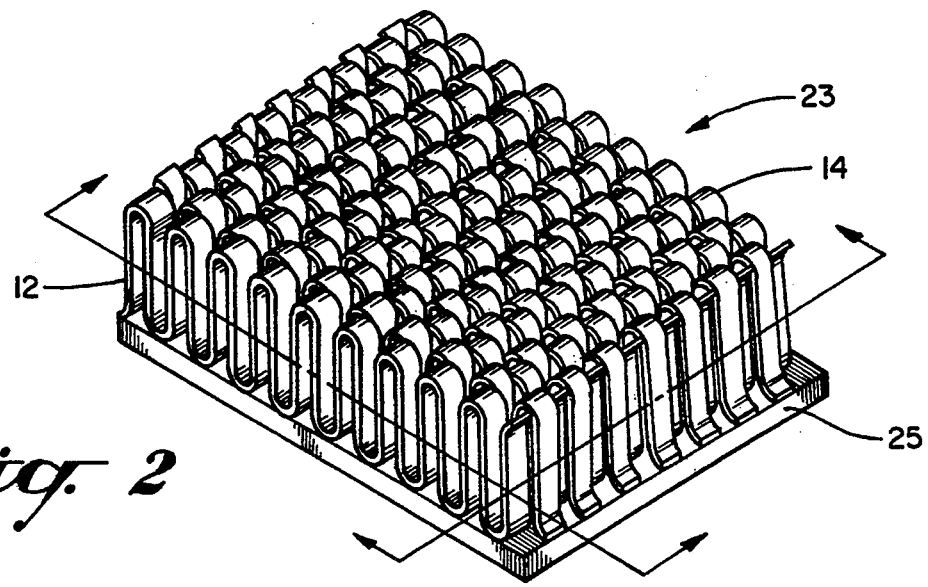
FIG. 2 is a heat sink assembled in accordance with a predetermined number of the fin assembly components as depicted in FIG. 1.
Figure 3:
FIG. 3 shows an alternate embodiment of an individual fin assembly component having a saw-tooth like configuration.
Figure 13:
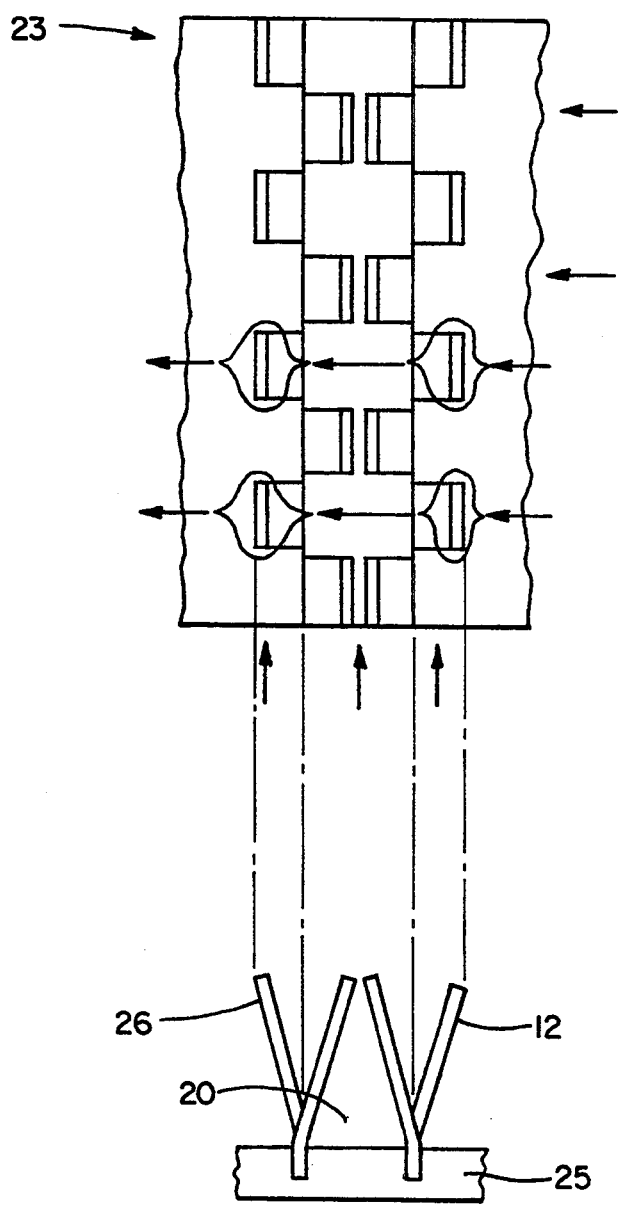
FIG. 13 is a combined elevational and plan view of segmented fin elements showing the manner in which the segments are mounted at predetermined acute angles on the base plate. In the orientation shown, segments in adjacent rows are first angled inwardly, next angled outwardly, et seq. to provide a pattern of alternate one segment offsets for interruption of fluid flow as depicted by arrows indicated therein.
Figure 14:
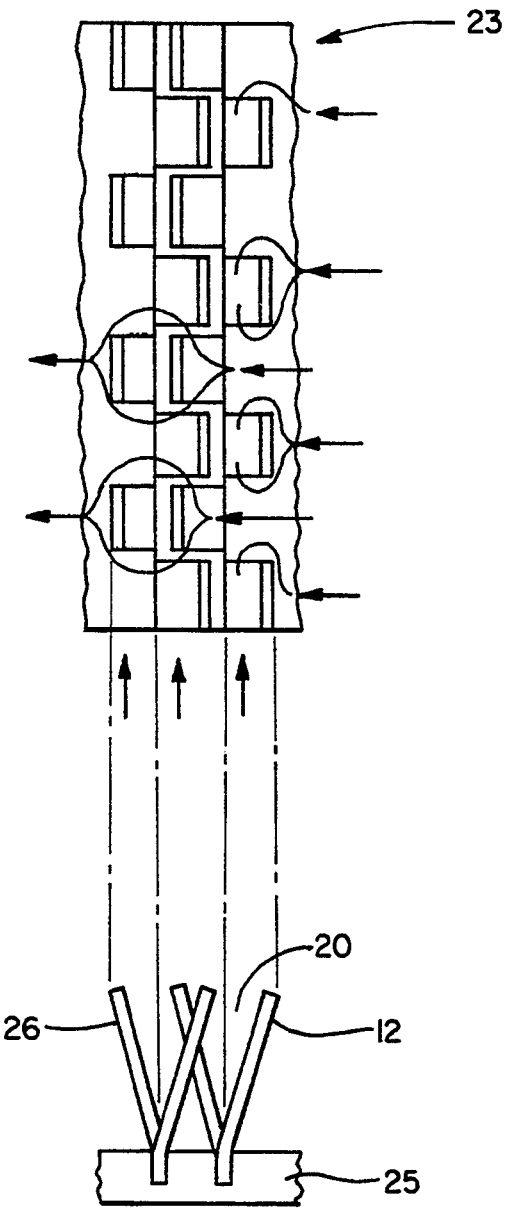
FIG. 14 is a combined elevational and plan view of segmented fin elements showing the manner in which they are mounted on the base plate. In the orientation shown, segments in adjacent rows are both angled outwardly to one side of the longitudinal direction of a finned element component, and next angled outwardly to the other side of the finned element component longitudinal axis, et seq. to provide a pattern of alternate one segment offsets for interruption of fluid flow as depicted by arrows indicated therein.

Now referring to the figures of the drawing wherein reference numerals are used to indicate like numbered parts, attention is directed to FIGS. 1 and 2. In FIG. 1 there is shown a single fin assembly component, generally indicated by reference numeral 10. The component 10 comprises a thick strip 12 of thermally conductive material formed into a plurality of corrugations 14. The corrugations 14 are formed in a manner to provide a width 16, a height 18, a channel 20 having a longitudinal dimension equal to the width 16 of the corrugations 14 and a heat element or corrugation pitch 22. An inventive heat sink apparatus as disclosed herein, generally indicated by reference numeral 23, has a configuration as shown in FIG. 2, wherein individual fin assembly components 10 as depicted in FIG. 1 are arranged offset to each other by half a corrugation pitch 22. Each of the individual assembly components may take the shape of FIGS. 1, 3, 4, or similar shapes. The segmented inventive heat sink apparatus as disclosed herein is generally indicated by reference number 23 as shown in FIGS. 13 and 14, wherein individual fins 26 are depicted as shown in FIG. 4 and are arranged as shown in FIGS. 13 and 14. The inventive heat sink apparatus 23, when applied to forced convection heat dissipation applications, can function as five different heat sinks by selective, appropriate use of covers, as shown in FIGS. 5, 6, 7, 8, and 9. It will be understood that fluid or air flow direction can be reversed without any reduction in heat absorption and/or heat dissipation In FIGS. 5, 6, 7, 8 and 9 the preferred embodiments are shown with the structural fin assembly components of FIG. 1. It will be understood, however, that a fin structure 24 as shown in FIG. 3 or a fin structure 26 as shown in FIG. 4 represent alternate preferred embodiments and may be utilized in the same manner as shown in connection with the covers of FIGS. 5, 6, 7. 8, and 9.

Figure 10:
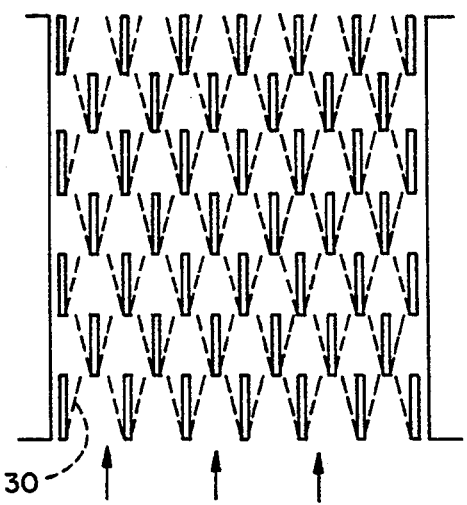
FIG. 10 shows a top plan view of the heat sink fin assembly taken along the lines 10—10 of FIG. 7 and the dotted lines of FIG. 10 indicate the pattern of boundary layer under either natural or forced convection applications.

FIG. 5 is a preferred embodiment using a three sided cover 28 with corrugated assembly components, or other appropriate construction, for applications where both high heat dissipation and low pressure drop are equally important. As shown in FIG. 10, a thermal boundary layer 30, shown as a dotted line, is repeatedly interrupted or broken up at each exit of a channel 20 of a fin assembly component in contradistinction to the teachings of prior art inventions, whether applied to natural or forced convection conditions. It will be understood that because the boundary layer thickness is so very small within a channel 20 of a fin assembly component 10, the overall thermal resistance also is very small, permitting a very high heat dissipation rate from the heat sink apparatus. Further, because the fluid or air flows through the corrugated fin assemblies in a longitudinal direction, there is a moderate or minimal pressure drop through the apparatus. This similar theory applies equally to the segmented fin concept as shown by the arrows in FIGS. 13 and 14. Fluid flow through the short channels 20 is interrupted at their exits, resulting in disruption of the thermal boundary layers thus enhancing heat transfer with only a moderate drop in pressure within the apparatus.

Figure 7:
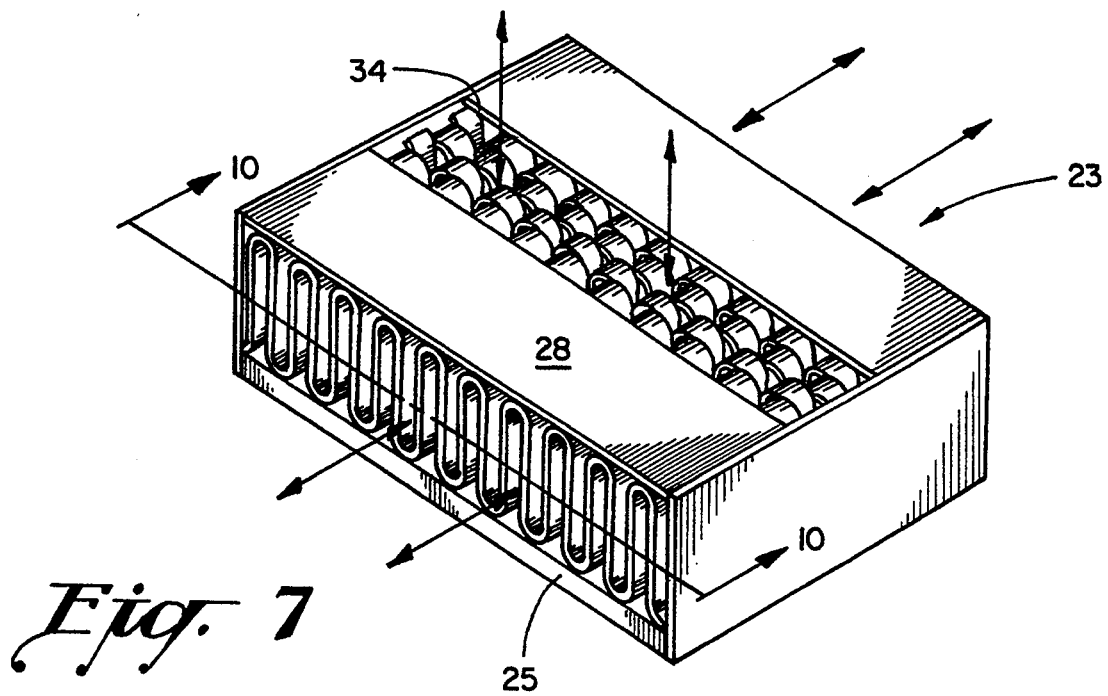
FIG. 7 shows a heat sink apparatus having corrugated fin assembly components wherein a cover includes an opening through which fluid flow may enter or exit and the fin assembly is oriented as seen FIG. 5. The fluid flow direction can be reversed.
Figure 8:
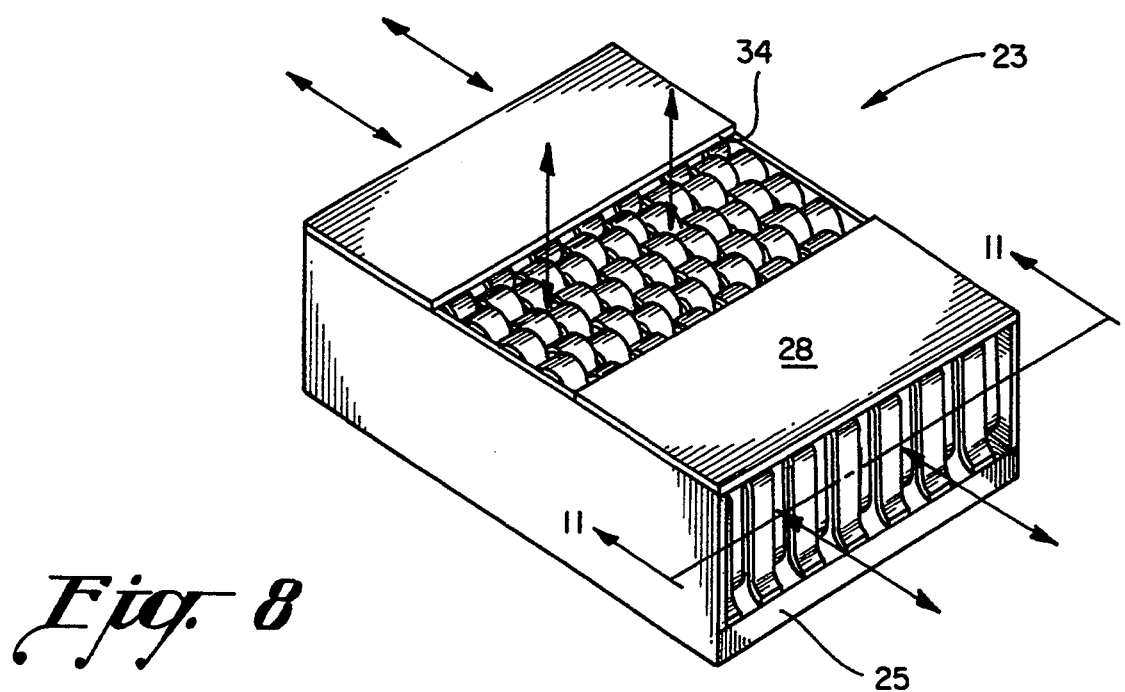
FIG. 8 is similar to FIG. 7, except that the cover means opening is angled 90 degrees from that shown in FIG. 7 and directs fluid flow to enter or exit the fin assembly as shown by the arrows.
Figure 11:
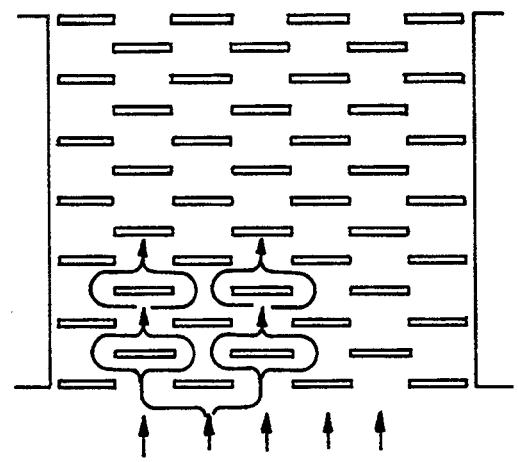
FIG. 11 is similar to FIG. 10, except that the top plan view is taken along the lines 11—11 of FIG. 8 and the pattern of fluid flow is indicated in a different manner under forced convection applications.
Figure 12:
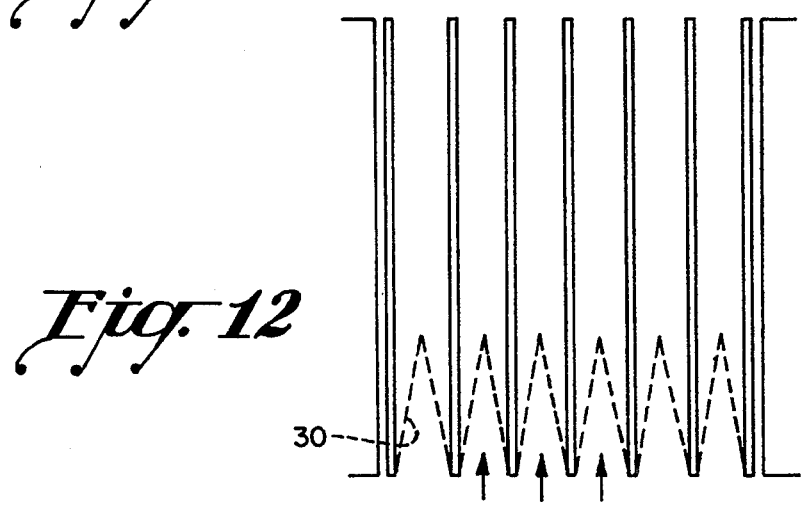
FIG. 12 is similar to FIGS. 10 and 11, except that it relates to prior art applications, under either natural of forced convection conditions, wherein the pattern of fluid flow causes a build up in boundary layer and under natural convection applications stops the flow of fluid. It also applies to prior art forced convection applications wherein the boundary layer has fully developed resulting in a lower rate of heat transfer.

The structure of FIG. 6 is used for applications in which a high rate of heat dissipation, shown with corrugated fin assembly components, is more important than a resulting pressure drop. In this application, using a cross-flow concept, as shown in FIG. 11, the flow of fluid or air impacts first on the wide side of a fin of the corrugated fin assembly and travels around and about the fin, and thereafter moves forwardly to the next fin, etc. In this manner, not only the thermal boundary layer is interrupted or broken up at each fin assembly component, but also the air flow impacts on and against the wide side of the fin, which greatly enhances the heat dissipating capability of the heat sink. There does result, however, in a pressure drop that is higher than that as shown in the arrangement of FIG. 5. This theory also applies to the segmented fin concept as shown by the arrows in FIGS. 13 and 14. The arrangements shown in FIGS. 7 and 8 depict two additional concepts using the cover 28, when it is desirable either to supply or discharge with corrugated fin assembly components flow of fluid or air to or from the center of the heat sink apparatus. The arrangement of FIG. 7 uses a cover 28 having an opening therein to allow a split fluid flow pattern that directs fluid flow into the top opening and out two sides of the apparatus. The arrangement of FIG. 8 includes cover 28 having its opening rotated ninety degrees from that shown in FIG.7 to allow a split flow pattern over the top of the fin assembly components 10 and out two sides of the apparatus in reverse fluid flow pattern from that shown in FIG. 6.

Figure 9:
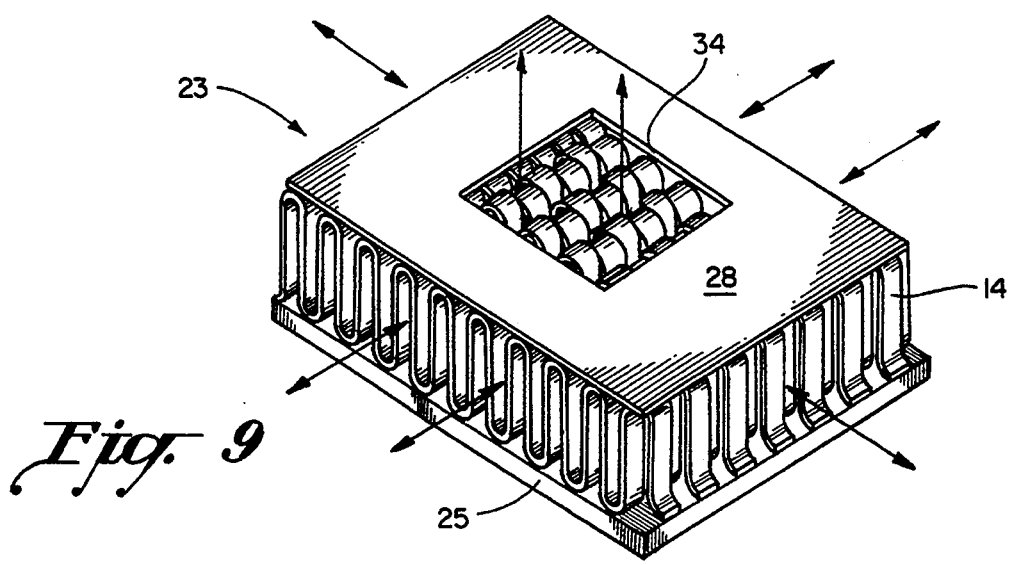
FIG. 9 is similar to FIG. 7 or FIG. 8, except that the cover has an opening located in its center and leaves uncovered the sides of the heat sink fin assembly so that fluid flow enters the top opening and exits the heat sink fin assembly in four different directions; or alternately, fluid flow enters the four sides of the heat sink fin assembly and exits from the top opening.

FIG. 9 is another preferred embodiment arrangement, wherein a high volume source of air flow in combination using corrugated fin assembly components, with a low static head pressure is available and air intake or discharge can be done from any side of the heat sink. It will be also understood that the embodiments depicted in FIGS. 7, 8 and 9 can be equipped with segmented fins of FIG. 4, sawtooth fin assembly components of FIG. 3, or other similar geometric configurations. Accordingly, as discussed hereinabove, it can be understood that the single unit construction heat sink apparatus is equivalent to five different heat sinks as exist in the prior art. It will be further understood that the present invention, when applied to natural convection heat dissipation applications, preferably employs the fluid flow pattern in the structural arrangement as shown in FIG. 2, but also may utilize the fin assembly components of FIGS. 3, 4 or any other similar such articles.

In the operation of the invention, the flow of fluid may be directed either through the channels formed in a finned assembly component or against the width thereof. In either case, it will be understood that because of the offset relationship between successive rows of heat exchange components, the flow of fluid is caused to take a circuitous path, changing directions each time the fluid enters a successive heat exchange component. As a result, it is possible to prevent any build up of thermal boundary layer and thereby achieve the highest rate of heat transfer attainable in a heat sink apparatus.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

I claim:

1. A heat sink apparatus comprising
    base plate means for thermal conduction therethrough,
    a plurality of elongate fin assembly means mounted on said base plate means for thermal conduction therethrough,
    each of said fin assembly means formed from a strip of thermally conductive material having a given thickness shaped into a plurality of corrugations having a given height and width wherein each of said corrugations has channel means for receiving fluid flow therethrough, and
    said channel means of each said corrugation having a longitudinal dimension corresponding to the width of said corrugation greater than the thickness of said strip of thermally conductive material,
    whereby when fluid flows through each of said channel means, thermal boundary layers are prevented from full development therewithin.

2. Heat sink apparatus as claimed in claim 1 comprising
    cover plate means secured to said fin assembly means on a side opposite from said base plate means,
    side member means secured to opposite sides of said fin assembly means so as to provide in combination with said base plate means and said cover plate means an enclosure having an inlet and outlet for fluid flow therebetween,
    said enclosure being effective to direct fluid flow into said inlet, through each channel means of said corrugations of said assembly means and out said outlet of said enclosure.

3. Heat sink apparatus as claimed in claim 1 comprising
    cover plate means secured to said fin assembly means on a side opposite from said base plate means,
    side member means secured to opposite sides of said fin assembly means so as to provide in combination with said base plate means and said cover plate means an enclosure having an inlet and outlet for fluid flow therebetween,
    said enclosure being effective to direct fluid flow into said inlet, against the width of said corrugations of said fin assembly means and out said outlet of said enclosure.

4. Heat sink apparatus as claimed in claim 1 wherein said longitudinal dimension of said channel means is of an order at least equal to the thickness of said thick strip.

5. Heat sink apparatus as claimed in claim 1 wherein said longitudinal dimension of said channel means ranges between a minimum of 0.10 inch and more than 0.50 inch.

6. Heat sink apparatus as claimed in claim 1 wherein said thickness of said strip ranges between a minimum of 0.010 inch and more than 0.10 inch.

7. Heat sink apparatus as claimed in claim 1 comprising
    cover plate means secured to said fin assembly means on a side opposite from said base plate means, said cover plate means having an opening formed therein,
    side member means secured to opposite sides of said fin assembly means so as to provide in combination with said base plate means and said cover plate means an enclosure having an inlet and two outlets for fluid flow therebetween,
    said enclosure being effective to direct fluid flow into said inlet, through each channel means of said corrugations of said assembly means and out said outlets of said enclosure.

8. Heat sink apparatus as claimed in claim 1 comprising
    cover plate means secured to said fin assembly means on a side opposite from said base plate means, said cover plate means having an opening formed therein,
    side member means secured to opposite sides of said fin assembly means so as to provide in combination with said base plate means and said cover plate means an enclosure having an inlet and two outlets for fluid flow therebetween,
    said enclosure being effective to direct fluid flow into said inlet against the width of said corrugations of said fin assembly means and out said outlets of said enclosure.

9. Heat sink apparatus as claimed in claim 1 comprising
    cover plate means secured to said fin assembly means on a side opposite from said base plate means forming a partial enclosure about said fin assembly means, said cover plate means having an opening formed therein for receiving and discharging fluid flow therethrough,
    said enclosure being effective to receive fluid flow into said opening of said cover plate means, for passage through each channel means of said corrugations of said fin assembly, against the width of said corrugations of said fin assembly means and out four sides of said partial enclosure.

10. A fin assembly component comprising
    thermally conductive thick strip means for mounting on a base plate,
    each of said strip means formed to provide an undulating shape having in alternating sequence a closed end portion and an open end portion forming side by side channel means for receiving flow of fluid therethrough each said undulating shape having a given width, and each said channel means having a longitudinal dimension substantially corresponding to said width, and a plurality of said strip means arranged side-by-side in abutting relationship to each other and offset by a predetermined distance so as to prevent straight-through flow of fluid between each abutting strip means.

11. A fin assembly component as claimed in claim 10 wherein said longitudinal dimension of said channel means ranges between a minimum of 0.10 inch and more than 0.50 inch.

12. Heat sink apparatus comprising thermally conductive base plate means, a plurality of elongate fin assembly component means mounted side-by-side on said base plate means for thermal conductivity therebetween, each of said fin assembly component means including a thick strip of heat conductive material formed into a plurality of heat conducting elements wherein each of said heat conducting elements has heat element pitch means and a fluid flow channel, said plurality of said fin assembly component means arranged in abutting contact with each other and offset by a distance equal to said heat element pitch means of each said plurality of heat conducting elements, and each said fluid flow channel of each said heat conducting element operable to receive fluid flow therethrough and having a linear dimension at least equal to the thickness of said strip of heat conductive material, whereby when fluid flows through each said fluid flow channel thermal boundary layer is prevented from development on the inner peripheral surface of each said heat conducting element.

* * * * *